US011329497B2

(12) United States Patent
Wippler

(10) Patent No.: US 11,329,497 B2
(45) Date of Patent: May 10, 2022

(54) WIRELESS CHARGER WITH RETENTION AND COOLING

(71) Applicant: Toyota Motor Engineering & Manufacturing North America, Inc., Plano, TX (US)

(72) Inventor: Erik A. Wippler, Canton, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 136 days.

(21) Appl. No.: 16/806,951

(22) Filed: Mar. 2, 2020

(65) Prior Publication Data

US 2021/0273476 A1 Sep. 2, 2021

(51) Int. Cl.
| H02J 7/00 | (2006.01) |
| H02J 7/02 | (2016.01) |
| H02J 50/90 | (2016.01) |
| H02J 50/80 | (2016.01) |
| B60R 16/03 | (2006.01) |
| H05K 7/20 | (2006.01) |
| H02J 50/10 | (2016.01) |

(52) U.S. Cl.
CPC ............... H02J 7/02 (2013.01); B60R 16/03 (2013.01); H02J 7/00032 (2020.01); H02J 7/0044 (2013.01); H02J 50/10 (2016.02); H02J 50/80 (2016.02); H02J 50/90 (2016.02); H05K 7/20145 (2013.01)

(58) Field of Classification Search
CPC .... H02J 7/02; H02J 50/90; H02J 50/80; H02J 7/0044; H02J 7/00032; H02J 50/10; B60R 16/03; H05K 7/20145

USPC .......................................... 320/108; 307/104
See application file for complete search history.

(56) References Cited

U.S. PATENT DOCUMENTS

| 6,282,906 | B1 | 9/2001 | Cauchy |
| 6,732,534 | B2 | 5/2004 | Spry |
| 8,826,830 | B2 | 9/2014 | Pajic |
| 8,947,047 | B2 | 2/2015 | Partovi et al. |
| 9,356,466 | B2 | 5/2016 | Han et al. |
| 9,604,565 | B2 | 3/2017 | Prasad et al. |
| 9,698,623 | B2 | 7/2017 | Adams et al. |
| 10,219,407 | B2 | 2/2019 | Lofy et al. |
| 10,286,862 | B2 | 5/2019 | Pkie et al. |
| 10,334,752 | B2 | 6/2019 | Shin et al. |
| 2007/0152633 | A1 | 7/2007 | Lee et al. |
| 2011/0056215 | A1 | 3/2011 | Ham et al. |
| 2015/0115877 | A1* | 4/2015 | Arai .................. H02J 50/00 320/108 |

(Continued)

FOREIGN PATENT DOCUMENTS

| DE | 102018201300 A1 | 7/2017 |
| KR | 2017084567 A | 8/2019 |

*Primary Examiner* — Zixuan Zhou
(74) *Attorney, Agent, or Firm* — Snell & Wilmer LLP

(57) ABSTRACT

Methods and systems for charging, retaining, and cooling a mobile device in a vehicle. The system includes a tray configured to receive the mobile device, the tray having a plurality of apertures. The system also includes a wireless charger coupled to the tray and configured to wirelessly charge the mobile device. The system also includes a suction device configured to draw air through the plurality of apertures of the tray and create a suction force for reducing lateral movement of the mobile device and cooling the mobile device.

20 Claims, 6 Drawing Sheets

(56) References Cited

U.S. PATENT DOCUMENTS

2018/0224909 A1* 8/2018 Koo .................. G06F 1/203

* cited by examiner

WIRELESS CHARGER WITH RETENTION AND COOLING

BACKGROUND

1. Field

This specification relates to a system and a method for retaining, cooling, and/or charging a mobile device in a vehicle.

2. Description of the Related Art

Occupants of vehicles may place their mobile devices on horizontal surfaces in the vehicle. For example, an occupant may place their mobile device on a horizontal surface along the dashboard or center console of a vehicle. However, when the vehicle makes sharp turns, the mobile device located on a horizontal surface may slide along the horizontal surface. For example, when the driver of a vehicle makes a sharp left-hand turn, the mobile device may slide to the passenger's side of the vehicle, away from the driver. The driver may attempt to reach for the mobile device so that the mobile device is within arm's reach of the driver. However, in reaching for the mobile device, the driver may divert attention away from the road, the driver may inadvertently steer the vehicle errantly, or the driver may apply more or less pressure than intended on a brake pedal or accelerator pedal. In any of these cases, the vehicle is driven in a potentially more dangerous manner than if the mobile device did not slide. Thus, there is a need for improved locations for storage of mobile devices in vehicles.

SUMMARY

What is described is a system for charging, retaining, and cooling a mobile device in a vehicle. The system includes a tray configured to receive the mobile device, the tray having a plurality of apertures. The system also includes a wireless charger coupled to the tray and configured to wirelessly charge the mobile device. The system also includes a suction device configured to draw air through the plurality of apertures of the tray and create a suction force for reducing lateral movement of the mobile device and cooling the mobile device.

Also described is a vehicle. The vehicle includes a tray configured to receive a mobile device, the tray having a plurality of apertures. The vehicle also includes a wireless charger coupled to the tray and configured to wirelessly charge the mobile device. The vehicle also includes a suction device configured to draw air through the plurality of apertures of the tray and create a suction force for reducing lateral movement of the mobile device and cooling the mobile device.

Also described is a method for charging, retaining, and cooling a mobile device in a vehicle. The method includes receiving, by a tray, the mobile device, the tray having a plurality of apertures. The method includes wirelessly charging, by a wireless charger coupled to the tray, the mobile device. The method includes drawing air, by a suction device, through the plurality of apertures of the tray to create a suction force for reducing lateral movement of the mobile device and cool the mobile device.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale, and may be exaggerated to better illustrate the important features of the present invention.

DETAILED DESCRIPTION

Disclosed herein are systems, vehicles, and methods for charging, retaining, and cooling a mobile device in a vehicle. Conventional wireless chargers use a platform to hold the device (e.g., cell phone). Many times, the phone can move around on the platform. This movement causes the charging to stop intermittently or completely, increasing charging time and user dissatisfaction.

Additionally, most wireless chargers charge at low (5 W) to medium (10 W) power. This requires the device being charged to rest on a charger tray or bin for upwards of two hours, depending on the battery state of charge and size. Charging for this length of time can cause excessive heat buildup. Additionally, charging at high power levels (above 10 W), speeds the process, but may also cause the phone to overheat. Onboard fail-safe measures inside the phone may monitor temperature and may cause the charging power to be reduced, or stop completely, to protect the device from damage.

The systems and methods described herein use a vacuum tray on charging surface, to secure the phone in place. Also, the movement of air pulled away from the charging surface, creates a cooling effect for the phone during charging, thus improving efficiency. Cooling the bin holding the mobile device will keep the device charging and prevent the device's own thermal management system from disabling charging.

Figure 1:
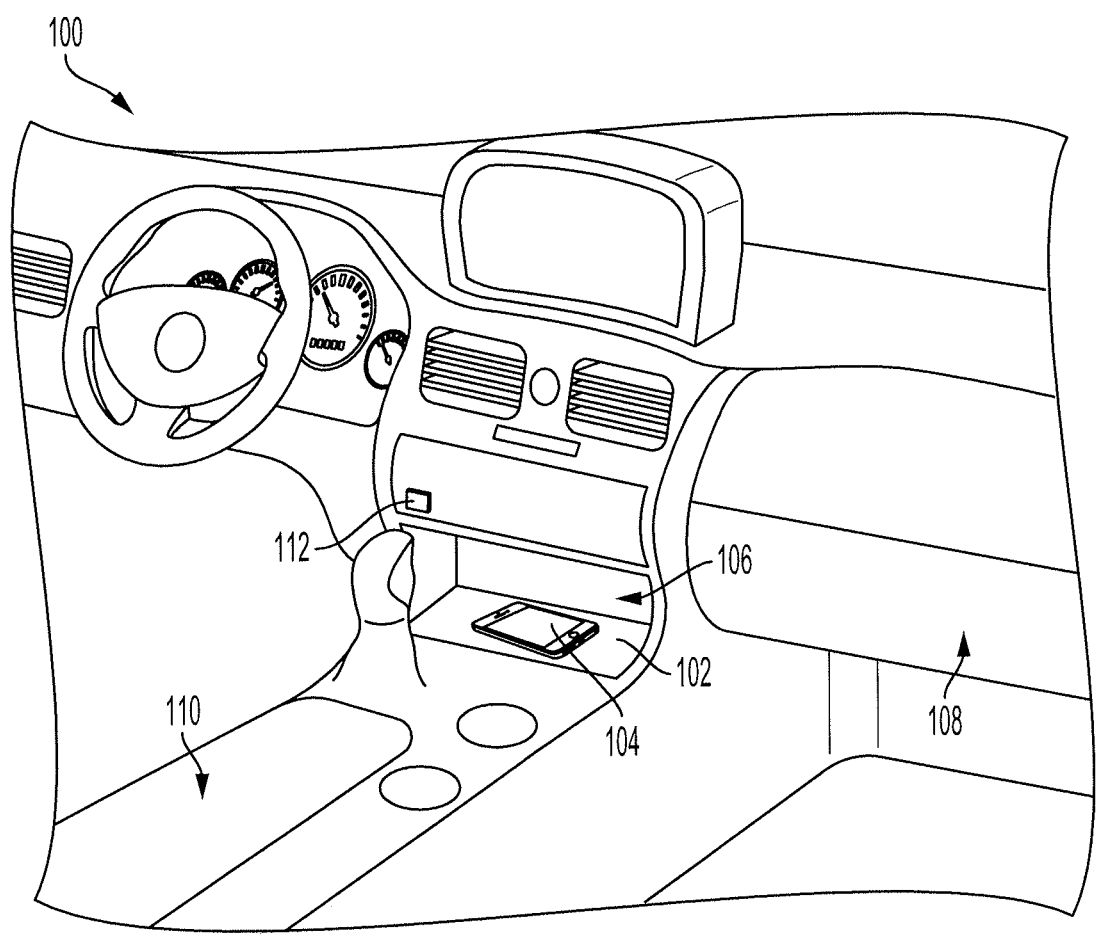
FIG. 1 illustrates a vehicle interior, according to various embodiments of the invention.

FIG. 1 illustrates an interior of the vehicle showing the system 100. The system 100 includes a tray 102 located at a storage location 106 in the interior of the vehicle. The storage location 106 is depicted in FIG. 1 as being below an infotainment unit and control panel of the vehicle and between the driver's seat and the passenger's seat of the vehicle. However, the storage location 106 may be any location in the vehicle where a mobile device 104 may be stored, such as in the center console 110 or a glove compartment 108. The tray 102 may be substantially flat and substantially horizontal, to allow for limited lateral movement of the mobile device 104 when the mobile device 104 is located on the tray 102. The tray 102 may be larger than the mobile device 104 to provide for convenient placement of the mobile device 104 on the tray by the user.

The tray 102 is configured to receive the mobile device 104. The tray 102 may receive the mobile device 104 when a bottom surface of the mobile device 104 contacts a top surface of the tray 102. The tray 102 may be capable of wirelessly charging the mobile device 104. The tray 102 may also be capable of retaining the mobile device 104 to reduce lateral movement and cool the mobile device 104 by drawing air from outside and above the tray 102 into and below the tray 102.

The system 100 may also include a button or switch 112 configured to toggle between operational modes of the system 100. The operational modes may include any combination of wireless charging and suction being activated or deactivated. That is, the operational modes may include (1) wireless charging being activated and suction being activated, (2) wireless charging being activated and suction being deactivated, (3) wireless charging being deactivated and suction being activated, and (4) wireless charging being deactivated and suction being deactivated. The user may elect to deactivate wireless charging if the user would like to prevent constant charging of the mobile device when the mobile device is already fully charged, or the user may desire to limit the heat generated by wireless charging. The user may elect to deactivate suction if the suction device creates noise that is unacceptable to the user. While the button or switch 112 is illustrated as being a hard button or switch, the button or switch 112 may be an icon on a touchscreen, a virtual button or switch toggled via voice command or motion gestures, or any other type of input to the system 100 indicating switching between operational modes.

The button or switch 112 may be a plurality of buttons or switches. For example, a first button or switch may be responsible for controlling whether the wireless charging is activated or deactivated, and a second button or switch may be responsible for controlling whether the suction is activated or deactivated.

In some embodiments, the wireless charger determines activation and deactivation automatically based on communications between the mobile device and the wireless charger, and the button or switch 112 is responsible for controlling whether the suction is activated or deactivated.

In addition to or in lieu of the switch, the system 100 may also include one or more sensors configured to detect the presence of the mobile device 104 and control the wireless charging and the suction. The one or more sensors may include a weight sensor configured to detect whether a mobile device is located on the tray. The weight sensor may be located below the tray and may detect a change in force exerted onto the tray when an object is placed on the tray. The one or more sensors may include an optical sensor configured to detect whether a mobile device is located on the tray. The optical sensor may be located in proximity to the tray and may detect when there is a change indicating the presence of an object (e.g., a laser and sensor configured to detect when the laser beam is interrupted, or a camera configured to detect when image data of the tray has changed, indicating the presence of an object on the tray).

The sensors may also include a temperature sensor of the mobile device 104, and when the temperature of the mobile device 104 exceeds a threshold temperature, the suction may be activated, if it was not already activated.

The wireless charger may use various methods to detect whether the mobile device located on the tray is capable of being wirelessly charged before beginning wireless charging. In some embodiments, when the wireless charger determines that the object located on the tray is not capable of wireless charging, and the one or more sensors nonetheless detect presence of an object, suction may be activated, but wireless charging may not be activated.

Figure 2A:
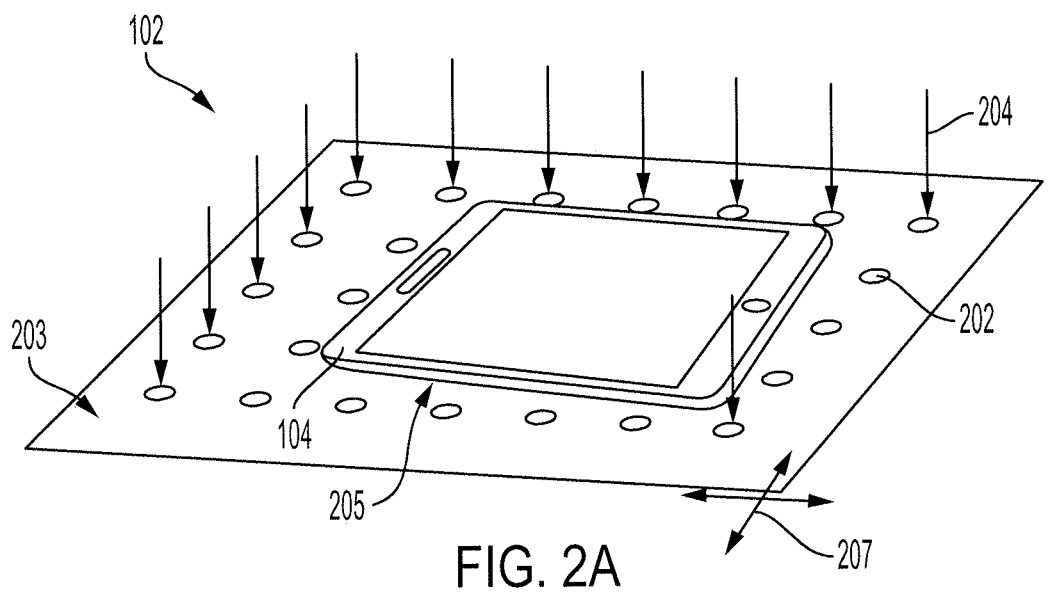
FIGS. 2A-2D illustrate various perspective views of a wireless charger, according to various embodiments of the invention.

FIG. 2A illustrates the tray 102 and the mobile device 104 on the tray 102. The mobile device 104 may be placed onto a top surface 203 of the tray 102. The tray 102 may be made of any rigid material that does not interfere with the wireless charging of the mobile device 104. For example, where the wireless charging is an inductive charging mechanism, the tray 102 may be made of a non-metal material, such as plastic.

The tray 102 may have multiple apertures 202. Air from within the vehicle interior may be drawn into the apertures 202 in a suction direction 204 into the tray 102. The drawing of the air into the apertures 202 causes a suction force onto a bottom surface 205 of the mobile device 104 contacting the top surface 203 of the tray 102. The suction force draws the bottom surface 205 of the mobile device 104 downward (e.g., toward the suction device, in the suction direction 204) and reduces lateral movement 207 of the mobile device 104 relative to the tray 102. That is, the suction force reduces movement of the mobile device 104 along a plane defined by the tray 102.

The drawing of the air into the apertures 202 also causes air to continuously move past the mobile device 104, causing cooling of the mobile device 104. The mobile device 104 operates more efficiently at cooler temperatures. In particular, the mobile device 104 may become more heated during charging. Thus, the systems and methods described herein provide for charging, retention, and cooling of the mobile device 104. The cooling of the mobile device 104 improves the functioning of the mobile device 104.

Figure 2B:
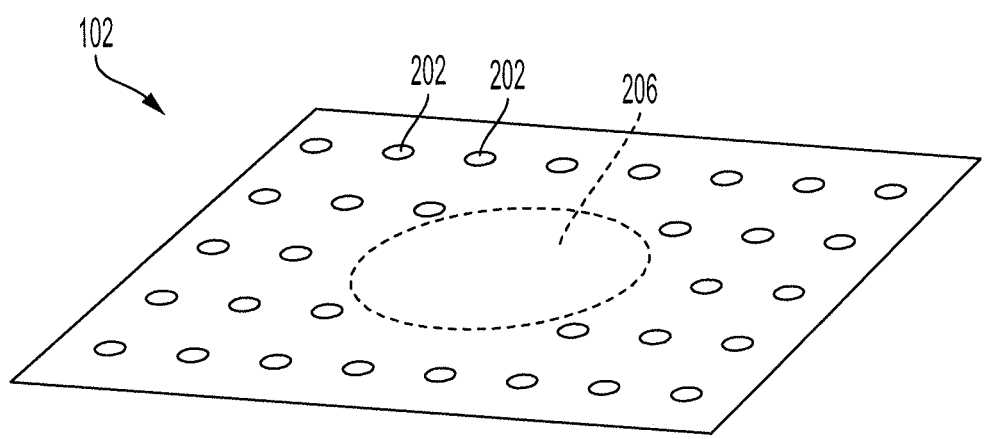

FIG. 2B illustrates the tray 102 and the apertures 202 without the mobile device 104. The tray 102 may include a wireless charger 206. The wireless charger 206 may be located in a central area of the tray 102. When the charging receiving apparatus of the mobile device 104 is aligned with the wireless charger 206, the mobile device 104 may be charged. There may be an absence of apertures 202 where the wireless charger 206 is located.

Figure 2C:
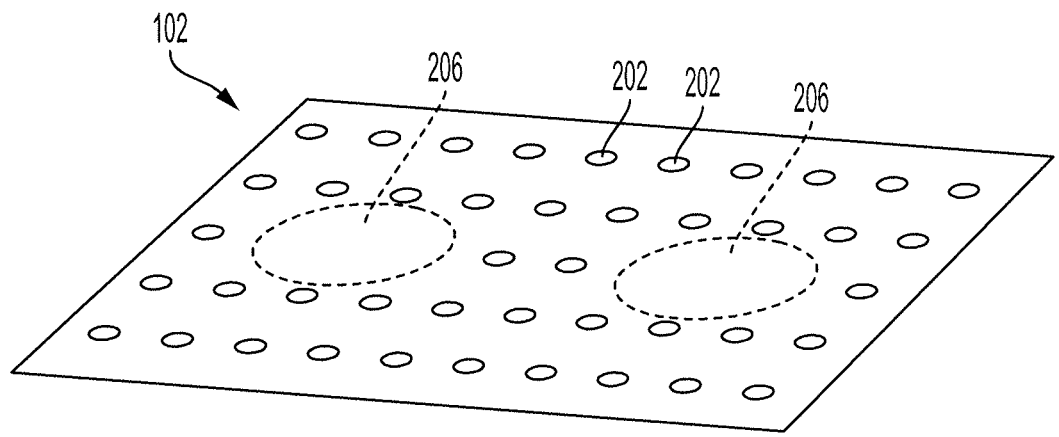

FIG. 2C illustrates the tray 102 and the apertures 202 without the mobile device 104. The tray 102 may include a plurality of wireless chargers 206 located in various locations of the tray 102. When the charging receiving apparatus of the mobile device 104 is aligned with any of the wireless chargers 206, the mobile device 104 may be charged. There may be an absence of apertures 202 where the wireless chargers 206 are located.

Figure 2D:
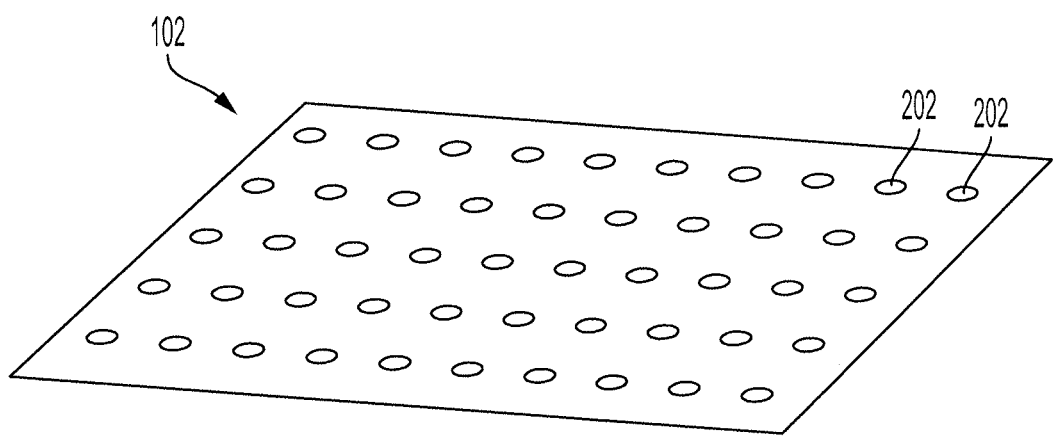

FIG. 2D illustrates an embodiment of the system without wireless charging capabilities. In this embodiment, there are no wireless chargers located on the tray 102, and the tray 102 includes apertures 202 as described herein for retention of the mobile device 104 and cooling of the mobile device 104.

Figure 2E:
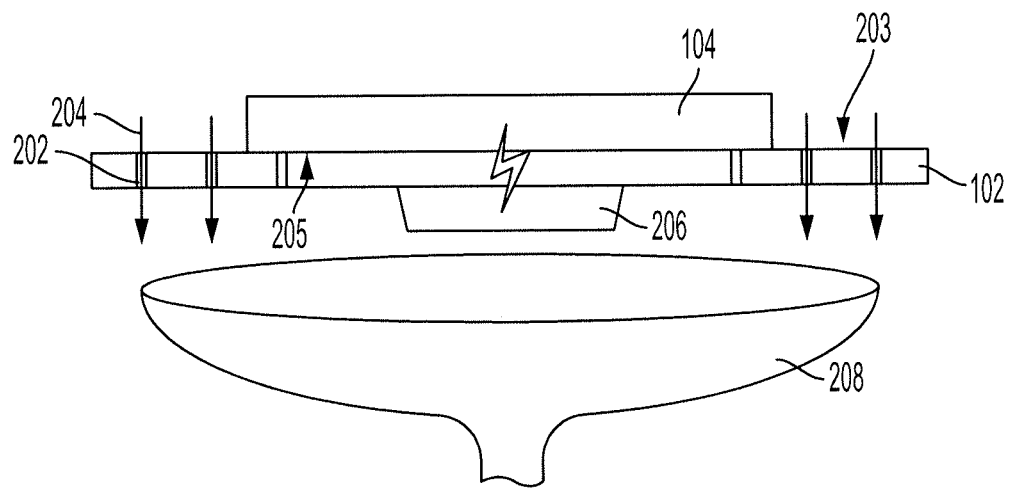
FIGS. 2E-2F illustrate various side cross-sectional views of a wireless charger, according to various embodiments of the invention.

FIG. 2E illustrates a side cross-sectional view. The mobile device 104 is located on top of the tray 102. More specifically, a bottom surface 205 of the mobile device 104 contacts the top surface 203 of the tray 102. The bottom surface 205 of the mobile device 104 may be opposite the surface of the mobile device 104 that is facing upward. The wireless charger 206 is located below the tray 102 and is configured to charge the mobile device 104.

The mobile device 104 covers one or more apertures 202, which are configured to draw air from within the vehicle interior into the apertures 202. More specifically, a suction device 208 (e.g., a vacuum) may be located below the tray 102 and the suction device 208 may draw air from the vehicle interior above the tray 102 through the apertures 202 in a suction direction 204. The air that enters the suction device 208 may be filtered and reintroduced into the vehicle interior via an HVAC system of the vehicle, or the air that enters the suction device 208 may be ejected outside of the vehicle to the environmental air outside of the vehicle. The suction device 208 may have various operational intensities.

A higher intensity may be used to increase retention of the mobile device and/or to increase the cooling of the mobile device.

As the air is drawn by the suction device 208 through the apertures 202 past the mobile device 104, the drawn air cools the mobile device 104. As illustrated in FIG. 2E, the bottom surface 205 of the mobile device 104 may make flush contact with the top surface 203 of the tray 102. Accordingly, the suction force created by the suction device 208 that draws the mobile device 104 toward the top surface 203 of the tray 102 may be relatively strong.

Figure 2F:
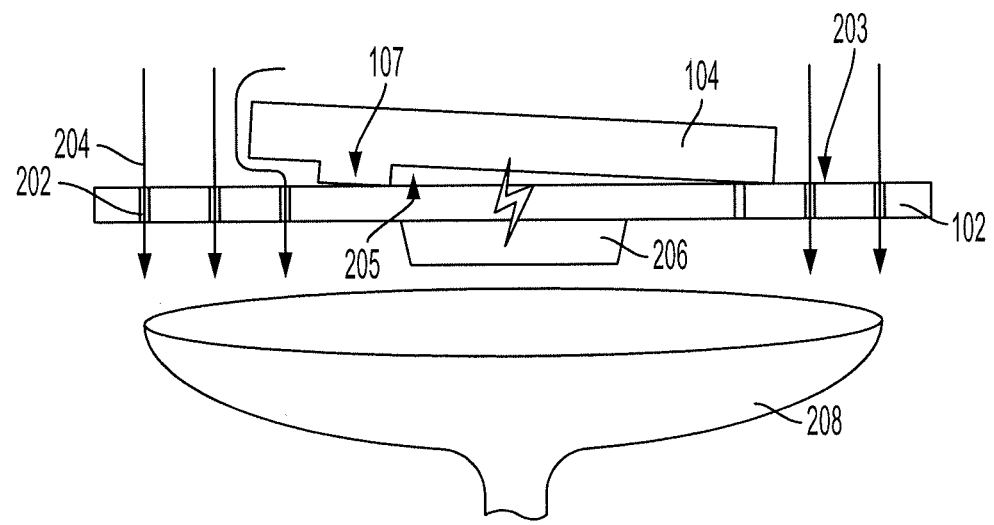

FIG. 2F illustrates a side cross-sectional view where the mobile device 104 has a feature 107 that protrudes from the bottom surface 205 of the mobile device 104. The feature 107 may prevent a suction force that is as strong as the suction force shown in FIG. 2E, where the bottom surface 205 of the mobile device 104 makes flush contact with the top surface 203 of the tray 102. However, additional air may be drawn through the apertures 202 underneath the mobile device 104 as a result of the feature 107 of the mobile device 104, and cooling of the mobile device 104 may be improved as a result of the increased airflow.

While the suction device 208 is illustrated as being directly underneath the tray 102, the suction device 208 may be located away from the tray 102, but in a sealed, fluid communication with the apertures 202 of the tray 102. For example, a tube or duct may connect an opening of the suction device 208 with the bottom side of the tray 102 and/or the apertures 202 of the tray 102, and the air may be drawn from the interior of the vehicle through the apertures 202 and through the tube or duct and into the suction device 208.

Also, while the tray 102 is illustrated as being horizontally flat, with the mobile device 104 located in a substantially horizontally flat orientation above the tray 102, in some embodiments, the tray 102 may be more vertically angled or substantially vertically oriented, and the mobile device 104 may also be in a substantially vertical orientation, with a bottom support surface preventing the mobile device 104 from falling down and sliding along the tray 102.

Figure 3:
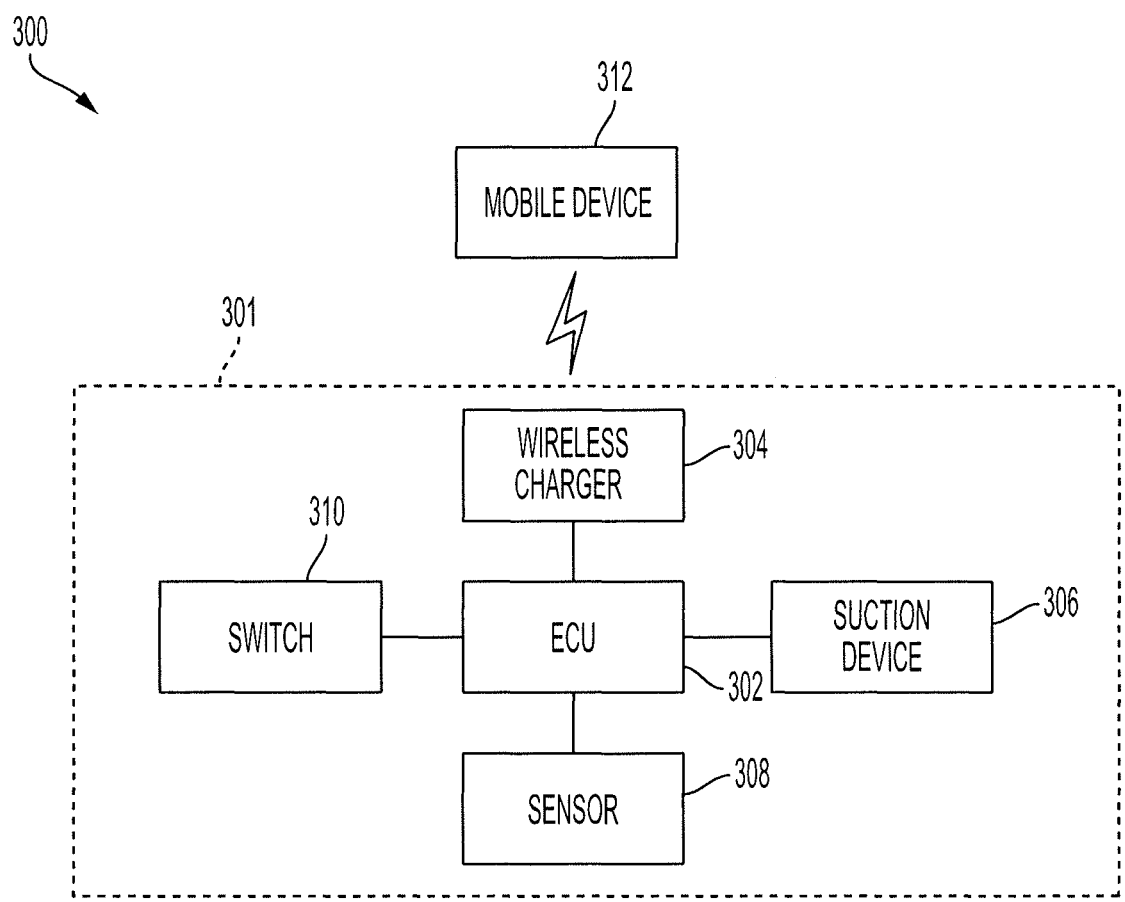
FIG. 3 illustrates a block diagram of the system, according to various embodiments of the invention.

FIG. 3 illustrates a block diagram of the system 300 (e.g., system 100). The system 300 includes an electronic control unit (ECU) 302, a wireless charger 304 (e.g., wireless charger 206), a suction device 306 (e.g., suction device 208), a sensor 308 (e.g., button or switch 112), and a mobile device 312 (e.g., mobile device 104). The ECU 302, the wireless charger 304, the suction device 306, the sensor 308, and the switch 310 may all be part of a vehicle 301 and the mobile device 312 may be located within the vehicle 301, but may or may not be an integrated part of the vehicle 301.

The vehicle 301 may have an automatic or manual transmission. The vehicle 301 is a conveyance capable of transporting a person, an object, or a permanently or temporarily affixed apparatus. The vehicle 301 may be a self-propelled wheeled conveyance, such as a car, a sports utility vehicle, a truck, a van or other motor or battery driven vehicle. For example, the vehicle 301 may be an electric vehicle, a hybrid vehicle, a plug-in hybrid vehicle, a fuel cell vehicle, or any other type of vehicle that includes a motor/generator. Other examples of vehicles include bicycles, planes, and any other form of conveyance that is capable of transportation. The vehicle 301 may be a semi-autonomous vehicle or an autonomous vehicle. That is, the vehicle 301 may be self-maneuvering and navigate without human input. An autonomous vehicle may use one or more sensors and/or a navigation unit to drive autonomously.

Each ECU 302 may be one or more ECUs, appropriately programmed, to control one or more operations of the vehicle. The one or more ECUs 302 may be implemented as a single ECU or in multiple ECUs. The ECU 302 may be electrically coupled to some or all of the components of the vehicle. In some embodiments, the ECU 302 is a central ECU configured to control one or more operations of the entire vehicle. In some embodiments, the ECU 302 is multiple ECUs located within the vehicle and each configured to control one or more local operations of the vehicle. In some embodiments, the ECU 302 is one or more computer processors or controllers configured to execute instructions stored in a non-transitory memory.

The wireless charger 304 is configured to be electrically coupled to the mobile device 312 and charge the mobile device 312. In some embodiments, the wireless charger 304 charges the mobile device 312 using inductive charging. In many embodiments, the mobile device 312 is a smartphone, but the mobile device 312 may be any device capable of being charged wirelessly. The wireless charger 304 may be capable of high charging rates (e.g., charging rates greater than 5 W).

The suction device 306 is configured to provide suction force onto the mobile device 312 through one or more apertures of a tray the mobile device 312 is located on, as described herein. The switch 310 is configured to toggle between multiple operational modes of the suction device 306 and the wireless charger 304. The switch 310 may be a hardware switch, such as a button or a switch, or the switch 310 may be a software-based switch, implemented as an icon on a touchscreen of the vehicle or a voice- or gesture-activated switch.

The switch 310 may receive an input from a user and communicate input data to the ECU 302, which may then control the suction device 306 and/or the wireless charger 304 based on the operational mode selected by the user using the switch 310.

The sensor 308 may be one or more sensors configured to detect the presence of the mobile device 312 on the tray, as described herein. The sensor 308 may detect sensor data and communicate the sensor data to the ECU 302, which may then control the suction device 306 and/or the wireless charger 304. The sensor 308 may also be one or more sensors configured to detect a temperature of the mobile device 312 on the tray, and when the temperature data indicates that the temperature of the mobile device 312 exceeds a temperature threshold, the ECU 302 may instruct the suction device 306 to be activated, if it was not already activated, or to increase suction strength, to increase cooling capability, until the temperature data indicates the temperature of the mobile device 312 is below the temperature threshold. When the sensor 308 is a temperature sensor, the temperature sensor may be located on the tray, near the mobile device, or may be an onboard component of the mobile device 312, which communicates the temperature data to the ECU 302 of the vehicle 301.

In some embodiments, the wireless charger 304 is configured to detect whether the mobile device 312 is capable of wireless charging, and the wireless charger 304 activates wireless charging accordingly. In these embodiments, the wireless charger 304 is also configured to detect when the mobile device 312 is fully charged and ceases wireless charging accordingly. In other embodiments, the ECU 302 communicates with the wireless charger 304 to determine whether the mobile device 312 is capable of wireless charging or whether the mobile device 312 is fully charged, and the ECU 302 instructs the wireless charger 304 accordingly.

When the wireless charger 304 determines that the mobile device 312 is not capable of wireless charging, the ECU 302 may nonetheless activate the suction device 306 to cool the mobile device 312 and retain the mobile device 312 despite not charging the mobile device 312. In some embodiments, the sensor data from the sensor 308 is used to confirm that a mobile device 312 is indeed located on the tray, so the suction device may be activated.

Figure 4:
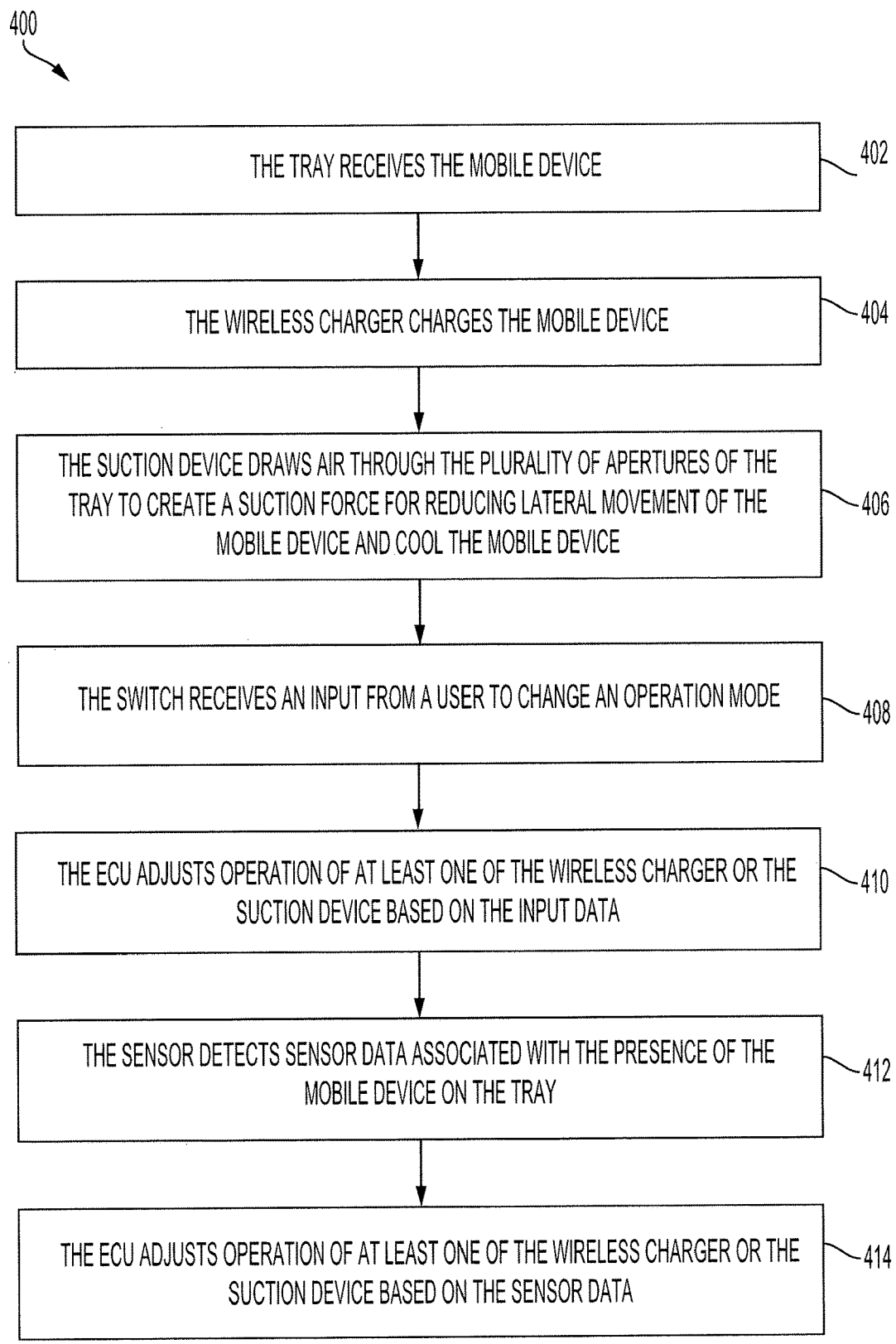
FIG. 4 illustrates a flow diagram of a process performed by the system, according to various embodiments of the invention.

FIG. 4 illustrates a flow diagram of a process 400 performed by the systems described herein.

A tray (e.g., tray 102) receives the mobile device (e.g., mobile device 104) (step 402). The tray may be larger than the mobile device and substantially flat. The tray may also be substantially horizontal, and may include a plurality of apertures (e.g., apertures 202).

A wireless charger (e.g., wireless charger 206, 304) charges the mobile device (step 404). The wireless charger may charge the mobile device using inductive charging. The wireless charger may perform steps to determine whether the mobile device is capable of being charged wirelessly. This may involve an exchange of data between the mobile device and the wireless charger using a short-range data communications protocol. The wireless charger may also receive charging data from the mobile device including a charging frequency and a charge level of the mobile device. The wireless charger may use the charging data from the mobile device when charging the mobile device.

A suction device (e.g., suction device 208, 306) draws air through the plurality of apertures of the tray to create a suction force for reducing lateral movement of the mobile device and cool the mobile device (step 406). The suction device may be on an opposite side of the tray as the mobile device. The bottom surface of the mobile device covers or partially covers at least one aperture of the plurality of apertures, and the suction force is exerted onto the bottom surface of the mobile device to draw the mobile device toward the suction device. The movement of air through the apertures around the mobile device cools the mobile device.

A switch (e.g., button or switch 112, switch 310) receives an input from a user to change an operation mode (step 408). The switch may be a hardware switch or a software switch, as described herein. The switch communicates input data associated with the input from the user to an electronic control unit (ECU) (e.g., ECU 302). The ECU adjusts operation of at least one of the wireless charger or the suction device based on the input data (step 410). Adjusting operation includes activating or deactivating the wireless charger or the suction device.

A sensor (e.g., sensor 308) detects sensor data associated with the presence of the mobile device on the tray (step 412). The sensor communicates sensor data to the ECU. The ECU adjusts operation of at least one of the wireless charger or the suction device based on the sensor data (step 414). Adjusting operation includes activating or deactivating the wireless charger or the suction device. For example, when the sensor detects the presence of the mobile device, the ECU may change the operation of the wireless charger and/or the suction device from deactivated to activated, and when the sensor detects the absence of the mobile device, the ECU may change the operation of the wireless charger and/or the suction device from activated to deactivated. In another example, when the sensor detects the temperature of the mobile device exceeds a threshold temperature, the ECU may change operation of the suction device from deactivated to activated or increase the intensity of suction. The ECU may deactivate the suction or reduce intensity of suction when the temperature of the mobile device falls below the threshold temperature.

Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A system for charging, retaining, and cooling a mobile device in a vehicle, the system comprising:
   a tray having a plurality of apertures and configured to receive the mobile device;
   a wireless charger coupled to the tray and configured to wirelessly charge the mobile device;
   a suction device configured to draw air through the plurality of apertures of the tray and create a suction force for reducing lateral movement of the mobile device and cooling the mobile device; and
   an electronic control unit (ECU) configured to detect whether the mobile device including an energy storage device is capable of wireless charging and control operation of the wireless charger and the suction device based on the detection.

2. The system of claim 1, further comprising a switch configured to receive an input from a user to toggle between a plurality of operational modes.

3. The system of claim 2, wherein the ECU is further configured to receive input data from the switch and activate or deactivate the wireless charger, or activate or deactivate the suction device based on the input data.

4. The system of claim 1, further comprising one or more sensors configured to detect sensor data indicating whether the mobile device is received by the tray.

5. The system of claim 4, wherein the ECU is further configured to receive the sensor data from the one or more sensors and activate or deactivate the wireless charger, or activate or deactivate the suction device based on the sensor data.

6. The system of claim 5, wherein the one or more sensors include at least one of a weight sensor, an optical sensor, or a temperature sensor.

7. The system of claim 1, wherein the tray includes a top surface configured to contact a bottom surface of the mobile device covering at least one of the plurality of apertures such that the suction force created by the suction device is exerted onto the bottom surface of the mobile device.

8. The system of claim 1, wherein the tray is located between a driver's seat and a passenger's seat in the vehicle and below an infotainment unit in the vehicle.

9. The system of claim 1, wherein the tray is substantially flat and larger than the mobile device.

10. A vehicle comprising:
    a tray configured to receive a mobile communications device and having a plurality of apertures;
    a wireless charger coupled to the tray and configured to wirelessly charge the mobile communications device;
    a suction device configured to draw air through the plurality of apertures of the tray and create a suction force for reducing lateral movement of the mobile communications device and cooling the mobile communications device; and an electronic control unit (ECU) configured to detect whether the mobile communications device is capable of wireless charging and control operation of the wireless charger and the suction device based on the detection.

11. The vehicle of claim 10, further comprising a switch configured to receive an input from a user to toggle between a plurality of operational modes.

12. The vehicle of claim 11, wherein the ECU is further configured to receive input data from the switch and activate or deactivate the wireless charger, or activate or deactivate the suction device based on the input data.

13. The vehicle of claim 10, further comprising one or more sensors configured to detect sensor data indicating whether the mobile communications device is received by the tray.

14. The vehicle of claim 13, wherein the ECU is further configured to receive the sensor data from the one or more sensors and activate or deactivate the wireless charger, or activate or deactivate the suction device based on the sensor data.

15. The vehicle of claim 14, wherein the one or more sensors include at least one of a weight sensor, an optical sensor, or a temperature sensor.

16. The vehicle of claim 10, wherein the tray includes a top surface configured to contact a bottom surface of the mobile communications device covering at least one of the plurality of apertures such that the suction force created by the suction device is exerted onto the bottom surface of the mobile communications device.

17. The vehicle of claim 10, wherein the tray is located between a driver's seat and a passenger's seat in the vehicle and below an infotainment unit in the vehicle.

18. The vehicle of claim 10, wherein the tray is substantially flat and larger than the mobile communications device.

19. A method for charging, retaining, and cooling a mobile electronic device in a vehicle, the method comprising:

receiving, by a tray having a plurality of apertures, the mobile electronic device;

wirelessly charging, by a wireless charger coupled to the tray, the mobile electronic device;

drawing air, by a suction device, through the plurality of apertures of the tray to create a suction force for reducing lateral movement of the mobile electronic device and cooling the mobile electronic device;

detecting, by an electronic control unit (ECU), whether the mobile electronic device is capable of wireless charging; and controlling operation of the wireless charger and the suction device based on the detecting.

20. The method of claim 19, further comprising controlling, by the ECU, an operation of the wireless charger or the suction device based on sensor data received from a sensor configured to detect a presence of the mobile electronic device or based on input data received from a switch configured to receive an input from a user.

* * * * *